US008698232B2

(12) United States Patent
Arzumanyan et al.

(10) Patent No.: US 8,698,232 B2
(45) Date of Patent: Apr. 15, 2014

(54) SEMICONDUCTOR DEVICE INCLUDING A VOLTAGE CONTROLLED TERMINATION STRUCTURE AND METHOD FOR FABRICATING SAME

(75) Inventors: Aram Arzumanyan, Burbank, CA (US); Timothy D. Henson, Torrance, CA (US); Ling Ma, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 908 days.

(21) Appl. No.: 12/655,668

(22) Filed: Jan. 4, 2010

(65) Prior Publication Data

US 2011/0163373 A1 Jul. 7, 2011

(51) Int. Cl.
*H01L 29/78* (2006.01)
*H01L 21/336* (2006.01)

(52) U.S. Cl.
USPC .................. 257/330; 257/E21.41; 438/270

(58) Field of Classification Search
USPC .................. 257/302, 330, E21.41, E29.262, 257/E27.091, E29.201, E29.257, E29.26, 257/E21.585; 438/259, 270
See application file for complete search history.

(56) References Cited

U.S. PATENT DOCUMENTS

| 5,316,959 | A | 5/1994 | Kwan |
| 5,430,324 | A | 7/1995 | Bencuya |
| 5,592,005 | A | 1/1997 | Floyd |
| 5,605,852 | A | 2/1997 | Bencuya |
| 6,031,265 | A | 2/2000 | Hshieh |
| 6,236,099 | B1 | 5/2001 | Boden |
| 6,462,376 | B1 | 10/2002 | Wahl |
| 6,700,158 | B1 | 3/2004 | Cao |
| 2004/0185622 | A1* | 9/2004 | Williams et al. ............... 438/270 |
| 2004/0195620 | A1* | 10/2004 | Chuang et al. ................ 257/335 |
| 2007/0004116 | A1 | 1/2007 | Hshieh |
| 2008/0012610 | A1* | 1/2008 | Aoki et al. ..................... 327/109 |
| 2008/0087951 | A1* | 4/2008 | Takaya et al. ................ 257/334 |
| 2008/0121986 | A1 | 5/2008 | Hshieh |
| 2008/0179662 | A1 | 7/2008 | Hshieh |
| 2008/0265279 | A1* | 10/2008 | Foerster ........................ 257/190 |

FOREIGN PATENT DOCUMENTS

| WO | WO 97/07548 A1 | 2/1997 |
| WO | WO 01/99198 A2 | 12/2001 |
| WO | WO 2004/102673 A2 | 11/2004 |

* cited by examiner

*Primary Examiner* — Selim Ahmed
(74) *Attorney, Agent, or Firm* — Farjami & Farjami LLP

(57) ABSTRACT

According to one embodiment, a semiconductor device including a voltage controlled termination structure comprises an active area including a base region of a first conductivity type formed in a semiconductor body of a second conductivity type formed over a first major surface of a substrate of the second conductivity type, a termination region formed in the semiconductor body adjacent the active area and including the voltage controlled termination structure. The voltage controlled termination structure includes an electrode electrically connected to a terminal of the semiconductor device. In one embodiment, the electrode of the voltage controlled termination structure is electrically connected to a gate terminal of the semiconductor device. In one embodiment, the electrode of the voltage controlled termination structure is electrically connected to a source terminal of the semiconductor device.

20 Claims, 4 Drawing Sheets

SEMICONDUCTOR DEVICE INCLUDING A VOLTAGE CONTROLLED TERMINATION STRUCTURE AND METHOD FOR FABRICATING SAME

BACKGROUND OF THE INVENTION

1. Field of the Invention

The present invention is generally in the field of semiconductors. More specifically, the present invention is in the field of fabrication of power semiconductor devices.

2. Background Art

Power semiconductor devices, such as metal-oxide-semiconductor field-effect transistors (MOSFETs), for example, are widely used in a variety of electronic devices and systems. Examples of such electronic devices and systems are power supplies and motor controllers, in which vertically conducting trench type silicon MOSFETs, for instance, may be implemented as power switches.

As the performance requirements placed on modern electronic systems grow ever more stringent, power losses within a semiconductor device, as well as factors affecting switching speed, become increasingly important. One measure of the efficiency of a power MOSFET switch is its ON-resistance, or $R_{dson}$. Optimizing $R_{dson}$ in a vertical trench MOSFET, for example, may require carefully controlling the length of the channel. That is to say, implementation of a vertical trench MOSFET having a short channel may improve the $R_{dson}$ characteristic of the device.

However, attempts to lower $R_{dson}$ by reducing channel length may give rise to significantly undesirable operational phenomena as byproducts of the constraints imposed during the fabrication process. For example, current leakage when the MOSFET is in a nominally OFF state may sometimes be observed in short channel vertical devices otherwise displaying highly desirable performance characteristics. Unfortunately, conventional power semiconductor fabrication strategies have failed to achieve optimum performance while also adequately assuring device reliability by preventing current leakage when the device is switched OFF.

Thus, there is a need to overcome the drawbacks and deficiencies in the art by providing a semiconductor device configured to prevent current leakage during an OFF state of the device.

SUMMARY OF THE INVENTION

A semiconductor device including a voltage controlled termination structure and method for fabricating same, substantially as shown in and/or described in connection with at least one of the figures, as set forth more completely in the claims.

DETAILED DESCRIPTION OF THE INVENTION

Figure 1:
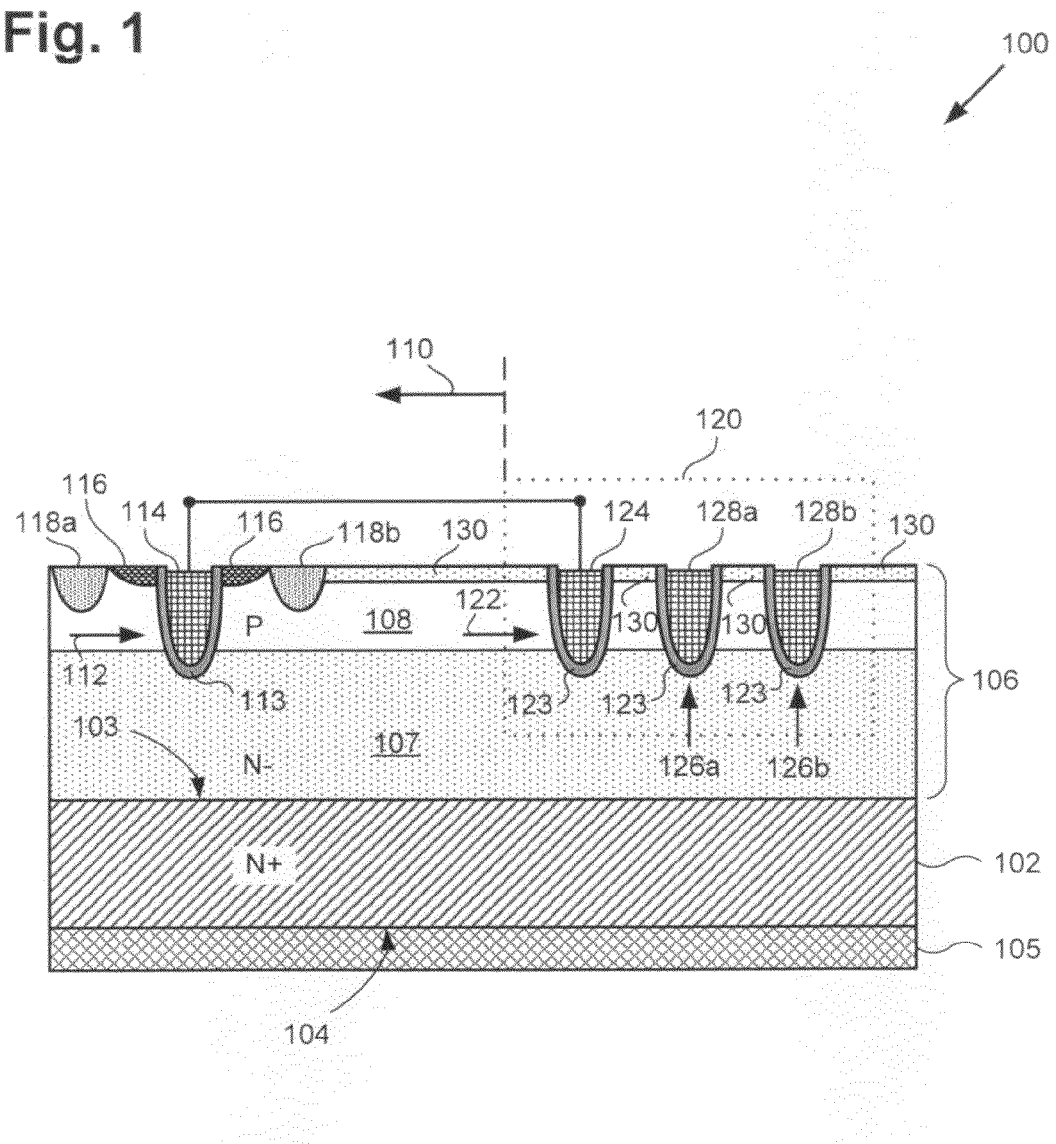
FIG. 1 shows a cross-sectional view of a semiconductor device including a voltage controlled termination structure, according to one embodiment of the present invention.

The present invention is directed to a semiconductor device including a voltage controlled termination structure and method for fabricating same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of semiconductor device 100 including a voltage controlled termination structure, according to one embodiment of the present invention. Semiconductor device 100, in FIG. 1, which may be a metal-oxide-semiconductor field-effect transistor (MOSFET) implemented in silicon, for example, is shown as a vertical trench type device.

As shown in FIG. 1, in one embodiment, semiconductor device 100 may include N type substrate 102 having major surfaces 103 and 104, N type semiconductor body 106 formed over major surface 103 of substrate 102, and P type base region 108 formed in semiconductor body 106 over drift region 107. Semiconductor device 100 comprises active area 110, which includes a portion of base region 108. Active area 110 also includes gate trench 112 containing gate insulator 113 and gate electrode 114, source regions 116, which may be highly doped N+ regions in the present embodiment, and source/base contacts 118a and 118b bordering source regions 116.

As further shown in FIG. 1, semiconductor device 100 additionally comprises termination region 120, formed in semiconductor body 106, adjacent to active area 110. According to the embodiment of FIG. 1, termination region 120 includes a plurality of trenches including voltage controlled termination structure 122 having electrode 124 electrically coupled to gate electrode 114, and termination trenches 126a and 126b. Also shown in FIG. 1 are trench insulators 123 formed in each of voltage controlled termination structure 122 and termination trenches 126a and 126b, trench fillers 128a and 128b formed in respective termination trenches 126a and 126b, parasitic layer 130, and drain contact 105 formed over major surface 104, on the opposite side of substrate 102 from base region 108.

It is noted that the device features represented in FIG. 1 are provided as specific implementations of the present inventive principles, and are shown with such specificity merely as an aid to conceptual clarity. It should be further understood that particular details such as the type of semiconductor device shown in FIG. 1, its layout or architecture, and the specific conductivity types shown, are being provided as examples, and should not be interpreted as limitations.

For example, although the embodiment shown in FIG. 1 shows P type base region 108 formed in N type semiconductor body 106 situated over N type substrate 102, in other embodiments, other arrangements are possible. In general, the only relational constraint imposed among base region 108, semiconductor body 106, and substrate 102 is that base region 108 having one conductivity type is formed in semiconductor body 106 having another conductivity type, and that the another conductivity type of semiconductor body 106 also characterize substrate 102. Moreover, the present representation of voltage controlled termination structure 122 as a trench structure apparently similar in form and dimension to gate trench 112 is simply one alternative. In other embodiments, termination structure 122 can comprise any structure suitable for use in providing field termination for semiconductor device 100.

In some embodiments, semiconductor device 100 may comprise a low gate-to-source voltage (low Vgs) device. For example, when semiconductor device 100 is turned ON, source 116 may be grounded, while a relatively low voltage, such as 2.5 V or 4.5 V for example, is applied to gate electrode 114, resulting in a Vgs of 2.5 V or 4.5 V, respectively. Drain contact 105 may be held at a voltage of from approximately 20 V to 30 V, for example, giving rise to drift of electrons from source regions 116 to drain contact 105, through drift region 107 of semiconductor body 106, which may be an epitaxial silicon body, for example. It is noted that although the present discussion describes specific embodiments in which termination of a drain voltage between approximately 20 V to 30 V is achieved, more generally, the disclosed inventive principles can be used to provide termination of voltages from approximately 10 V to approximately 100 V.

Because a low ON-resistance, or $R_{dson}$, can be especially important to the efficiency of a low Vgs device, special care may be taken during formation of base region 108, to assure that the channel length of semiconductor device 100 is kept short. Applicants have realized that processing steps intended to assure suitably short channel lengths can result in the presence of parasitic layer 130 situated over base region 108. As shown in FIG. 1, parasitic layer 130 may overlie portions of base region 108 not otherwise occupied by source regions 116, source/base contacts 118a and 118b, or trenches, such as gate trench 112, voltage controlled termination structure 122, and termination trenches 126a and 126b. Thus, as in the embodiment shown by semiconductor device 100, parasitic layer 130 can extend between source/base contact 118b and voltage controlled termination structure 122, and adjacent each side of termination trenches 126a and 126b.

Parasitic layer 130 may have substantially the same conductivity type characteristic of semiconductor body 106, e.g., the N type conductivity shown in drift region 107. However, as may be seen in FIG. 1, parasitic layer 130 is electrically connected to source regions 116 through source/base contacts 118a and 118b, which make ohmic contact with source regions 116 and base region 108. As a result, absent the techniques herein disclosed by Applicants, extension of parasitic layer 130 from source/base contact 118b into termination region 120 can produce undesirable drain-source leakage current when semiconductor device 100 is in an OFF state, as will be explained more fully in conjunction with FIG. 2.

Figure 2:
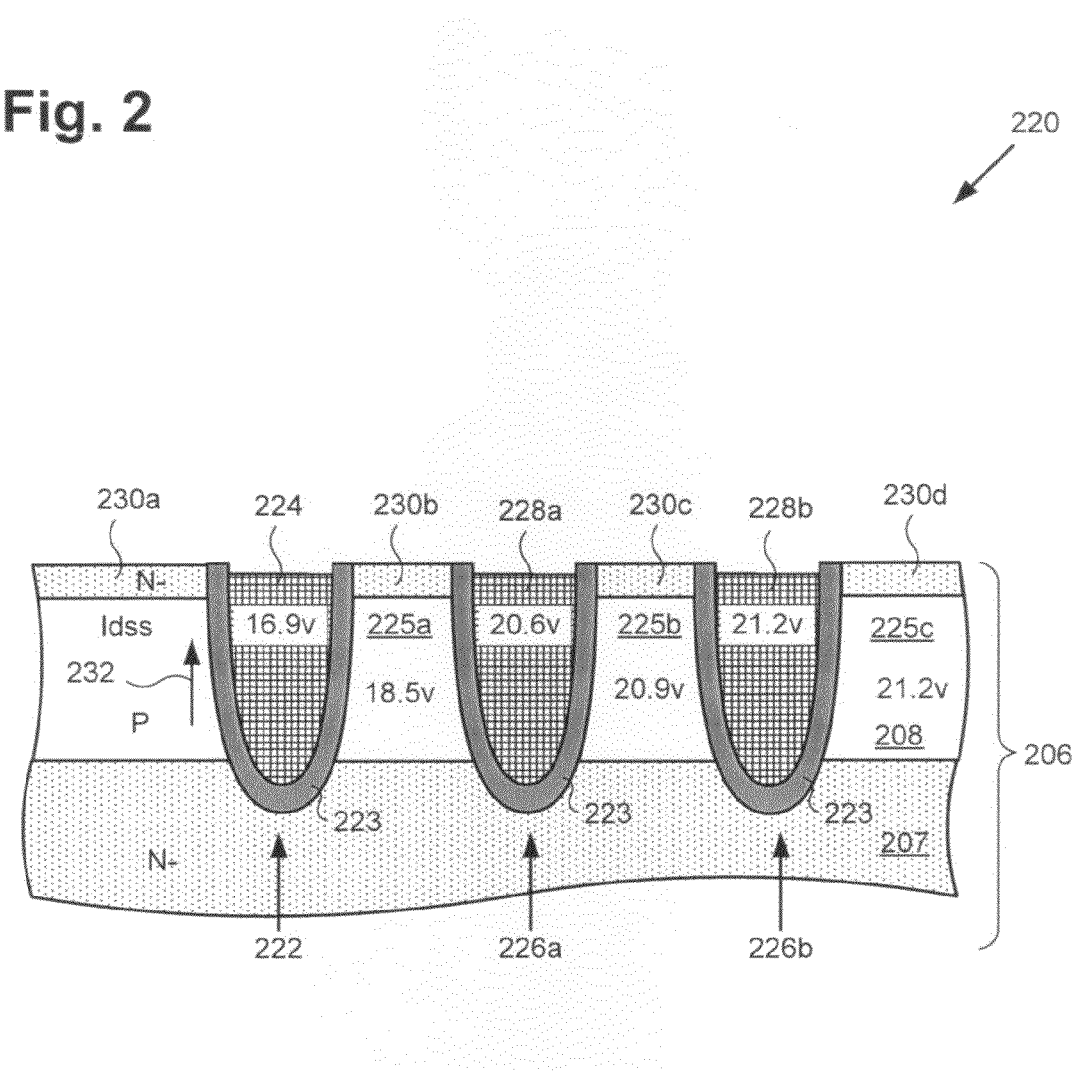
FIG. 2 is a cross-sectional view showing a termination region wherein an exemplary termination structure is not voltage controlled.

Turning to FIG. 2, FIG. 2 is a cross-sectional view showing termination region 220 wherein exemplary termination structure 222 is not voltage controlled. Termination region 220 corresponds in general to termination region 120, in FIG. 1, with one major exception: unlike the arrangement shown in FIG. 1, in which electrode 124 of voltage controlled termination structure 122 is connected to gate electrode 114, electrode 224 of termination structure 222, in FIG. 2, is floating. As shown in FIG. 2, termination region 220 is formed in semiconductor body 206 including drift region 207, base region 208, and parasitic layer regions 230a, 230b, 230c, and 230d, corresponding to semiconductor body 106 including drift region 107, base region 108, and the regions of parasitic layer 130 appearing in FIG. 1. Also shown in FIG. 2 are termination trenches 226a and 226b, trench insulator 223, and trench fillers 228a and 228b, corresponding respectively to termination trenches 126a and 126b, trench insulator 123, and trench fillers 128a and 128b, in FIG. 1. FIG. 2 further includes mesa regions 225a, 225b, and 225c, which are represented by the structure shown in FIG. 1, but not explicitly labeled in that figure.

Referring back to FIG. 1, in an OFF state of semiconductor device 100, source regions 116 and gate electrode 114 are electrically connected, e.g., mutually grounded, through external connections (not shown in FIG. 1). Consequently, both gate electrode 114 and source regions 116 are effectively shorted to base region 108 through source/base contacts 118a and 118b when semiconductor device 100 is OFF. Recalling that approximately 20 V to 30 V may typically be applied to drain contact 105, termination region 120 must mediate the voltage gradient from drain contact 105 to grounded or very low voltage active region 110 when semiconductor device 100 is OFF.

Returning to FIG. 2, and assuming an applied drain voltage of approximately 22 V, for example, the absence of a voltage controlled termination structure in termination region 220 can be expected to result in the lateral voltage gradient spanning termination structure 222, mesa region 225a, termination trench 226a, mesa region 225b, termination trench 226b, and mesa region 225c. Because each of termination structure 222 and termination trenches 226a and 226b are floating, the distribution of voltages across termination region 220 creates an abrupt voltage transition where termination structure 222 meets parasitic layer region 230a.

Bearing in mind that parasitic layer region 230a has a conductivity similar to drift region 207 of semiconductor body 206, that it is effectively grounded by being in contact with source/base contact 118b (not shown in FIG. 2), and that it is both adjacent to relatively high potential electrode 224 and opposite drift region 207 from high potential drain contact 105 (also not shown in FIG. 2), and it becomes apparent that Idss leakage current 232 may be produced. In other words, the conductivity type of parasitic layer region 230a, in combination with the high voltage at electrode 224 and the influence of the drain voltage on the other side of the substrate can cause parasitic layer region 230a to act as a pseudo source region, controlled by termination structure 222 acting as a pseudo gate, resulting in Idss leakage current 232. Consequently, if electrode 224 of termination structure 222 is not voltage controlled, and is allowed to float as in FIG. 2, then the semiconductor device in which termination structure 222 is implemented may produce a highly undesirable drain-source leakage current when that semiconductor device is in an OFF state.

Figure 3:
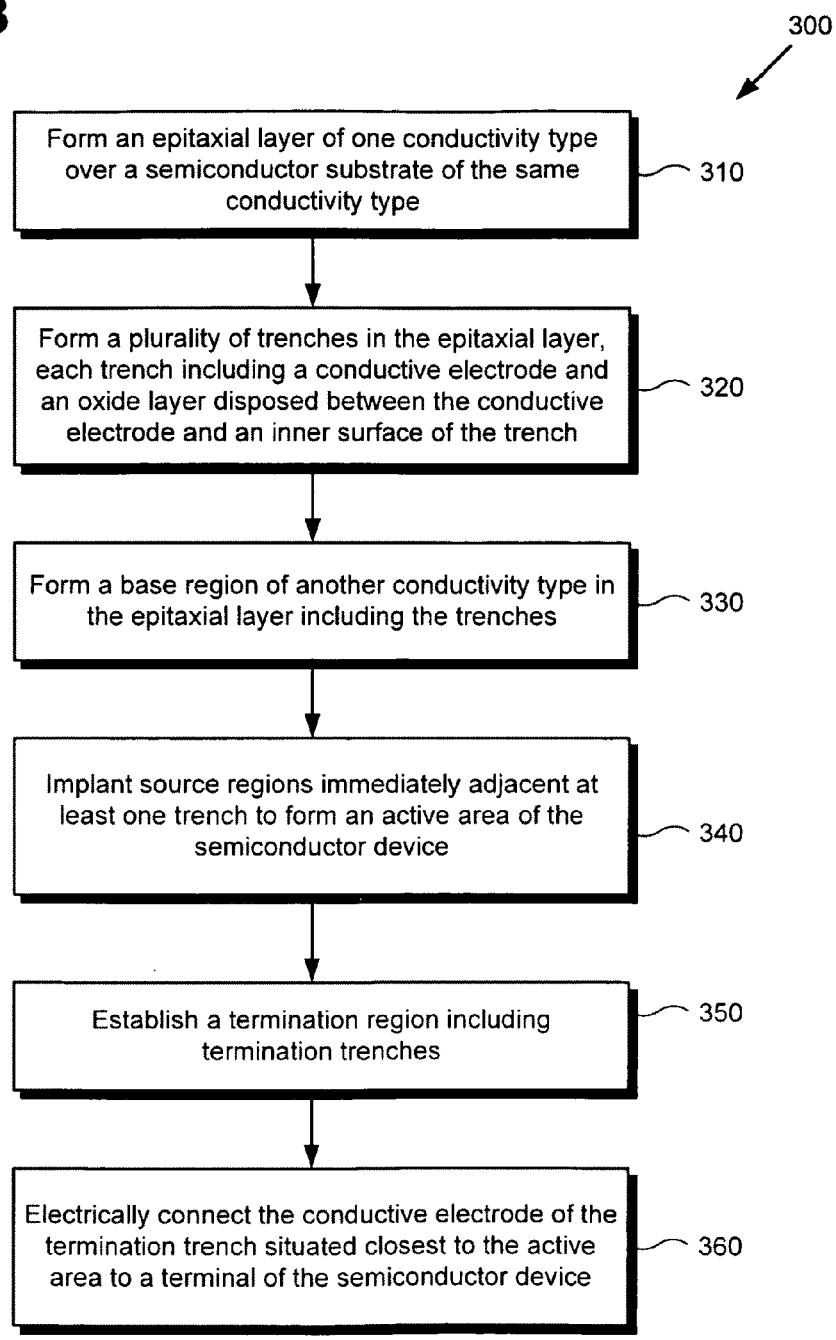
FIG. 3 shows a flowchart presenting a method for fabricating a semiconductor device including a voltage controlled termination structure, according to one embodiment of the present invention.

The approach adopted by Applicants to mitigate the presence of parasitic layer region 230a so as to reduce or eliminate Idss current 232 when the semiconductor device is OFF will now be further described by reference to FIG. 3 in combination with FIG. 1. FIG. 3 presents flowchart 300 describing one embodiment of a method for fabricating a semiconductor device including a voltage controlled termination structure.

Certain details and features have been left out of flowchart 300 that are apparent to a person of ordinary skill in the art. For example, a step may comprise one or more substeps or may involve specialized equipment or materials, as known in the art. While steps 310 through 360 indicated in flowchart 300 are sufficient to describe one embodiment of the present invention, other embodiments of the invention may utilize steps different from those shown in flowchart 300, or may comprise more, or fewer, steps.

Referring to step 310 in FIG. 3 and semiconductor device 100 in FIG. 1, step 310 of flowchart 300 comprises forming an epitaxial layer of one conductivity type, e.g., N type semiconductor body 106, over a semiconductor substrate of the same conductivity type, e.g., N type substrate 102. It is noted that semiconductor body 106, which may be epitaxially grown on substrate 102 is formed prior to P type base region 108. Consequently, when step 310 occurs, the substantial entirety of semiconductor body 106 is of one conductivity type.

Moving on to step 320 in FIG. 3 and continuing to refer to semiconductor device 100, in FIG. 1, step 320 of flowchart 300 comprises forming a plurality of trenches in the epitaxial layer, e.g., forming gate trench 112, the trench of voltage controlled termination structure 122 and termination trenches 126a and 126b in semiconductor body 106. Gate trench 112, the trench of voltage controlled termination structure 122 and termination trenches 126a and 126b may be formed through an etch process, for example, and then an oxide layer or other suitable trench insulator may be deposited on the inner surface of each trench to form what will ultimately be gate insulator 113 and trench insulator 123.

In addition, conductive electrodes may be formed in each trench to produce gate electrode 114, electrode 124, and trench fillers 128a and 128b. Gate electrode 114, electrode 124, and trench fillers 128a and 128b may comprise polysilicon, for example. Thus, despite fulfilling distinct functional roles in finished semiconductor device 100, in one embodiment, gate trench 112 including gate insulator 113 and gate electrode 114, voltage controlled termination structure 122 including trench insulator 123 and electrode 124, and termination trenches 126a and 126b including trench insulator 123 and respective trench fillers 128a and 128b may be formed using the same series of processing steps, may have substantially similar dimensions, and may comprise substantially identical materials.

Referring to step 330 of FIG. 3, step 330 of flowchart 300 comprises forming a base region of another conductivity type in the epitaxial layer. According to the embodiment shown in FIG. 1, step 330 corresponds to formation of P type base region 108 in semiconductor body 106, in which gate trench 112, voltage controlled termination structure 122, and termination trenches 126a and 126b are formed. Base region 108 may be formed by blanket implantation followed by an anneal process to drive the implanted dopants so as to produce a thickness of base region 108 suitable for providing a desired channel length, for example. As previously explained, in some embodiments, the formation of base region 108, in step 330, may result in the presence of N type parasitic layer 130 situated over base region 108 and adjacent to voltage controlled termination structure 122.

In one embodiment, step 330 may further include formation of recesses in base region 108 of semiconductor body 106, to receive source/base contacts 118a and 118b. Source/base contacts 118a and 118b may comprise metal contacts, for example, deposited on a highly doped contact film formed in the recess of each of source/base contacts 118a and 118b (contact film not shown in FIG. 1). The highly doped contact film has the same conductivity type as base region 108. For example, according to the embodiment of FIG. 1, the highly doped contact film may comprise a P+ film providing ohmic contact with P type base region 108.

Continuing with steps 340 and 350 of flowchart 300, step 340 comprises implanting source regions 116 immediately adjacent gate trench 112 to form active area 110 of semiconductor device 100. As shown in FIG. 1, source regions 116 are formed so as to make ohmic contact with source/base contacts 118a and 118b, and are thus effectively shorted to base region 108. According to one embodiment of the present invention, termination region 120 can be established substantially concurrently with step 340, in step 350, as a result of masking off of the portion of the epitaxial layer including base region 108, voltage controlled termination structure 122, and termination trenches 126a and 126b, prior to source implantation in step 340.

Moving to step 360 of FIG. 3, step 360 of flowchart 300 comprises electrically connecting electrode 124 of voltage controlled termination structure 122 to a terminal of semiconductor device 100. As shown in FIG. 1, in one embodiment, step 360 may correspond to connecting electrode 124 to gate electrode 114. Alternatively, gate electrode 124 could be connected to source region 116, via a source contact of semiconductor device 100, for example.

As previously explained, when semiconductor device 100 is OFF, gate electrode 114 and source regions 116 are externally coupled, and thus effectively shorted together. Because source regions 116 are further shorted to base region 108 through source/base contacts 118a and 118b, connecting electrode 124 to either of gate electrode 114 or source regions 116 causes electrode 124 to be electrically coupled to the portion of base region 108 in active area 110 when semiconductor device 100 is OFF. As a result, when semiconductor device 100 is OFF, there may be little or no voltage difference among gate electrode 114, source regions 116, base region 108 in active area 110, parasitic layer 130, and electrode 124 of voltage controlled termination structure 122.

Figure 4:
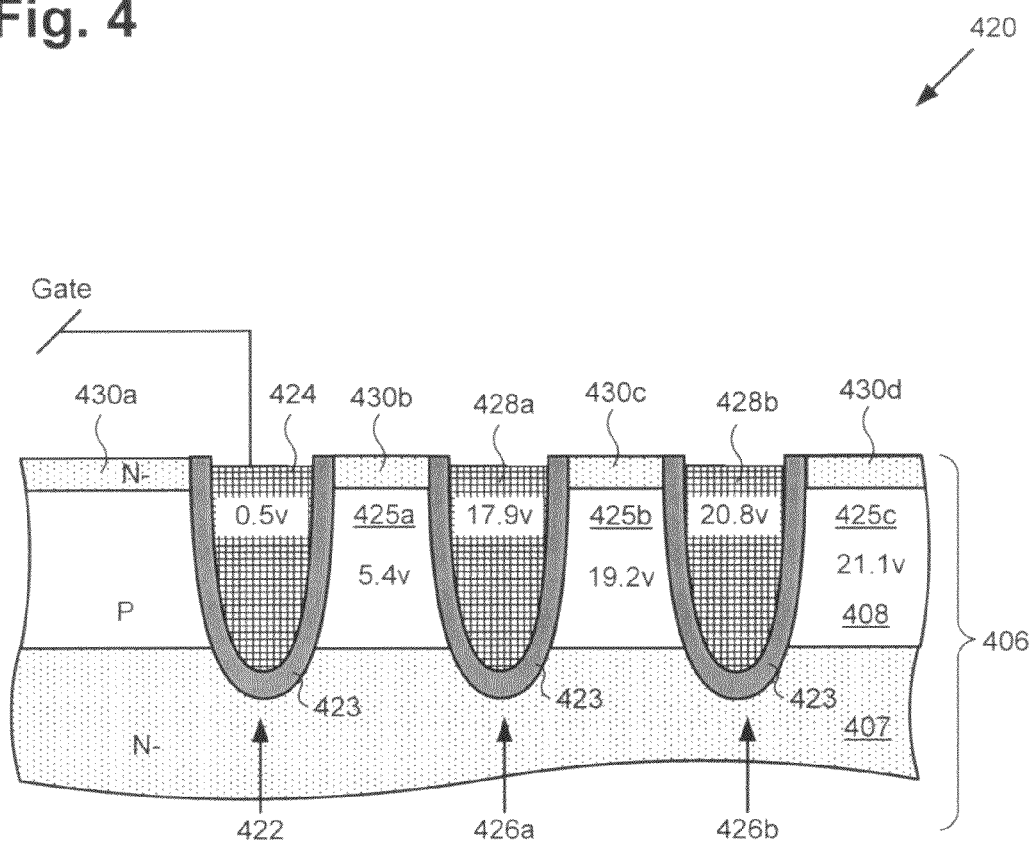
FIG. 4 is a cross-sectional view showing termination region 120 of FIG. 1 in greater detail, according to one embodiment of the present invention.

Referring now to FIG. 4, FIG. 4 is a cross-sectional view showing termination region 420, according to one embodiment of the present invention, corresponding to a more detailed view of termination region 120, in FIG. 1. Termination region 420, in FIG. 4, includes voltage controlled termination structure 422, shown as a trench structure, and including trench insulator 423 and electrode 424. Voltage controlled termination structure 422 including trench insulator 423 and electrode 424 corresponds to voltage controlled termination structure 122 including trench insulator 123 and electrode 124, in FIG. 1. As is the case for the semiconductor device of FIG. 1, electrode 424 of voltage controlled termination structure 422 is electrically connected to a gate of the semiconductor device of FIG. 4 (gate connection represented but not explicitly shown).

As shown in FIG. 4, termination region 420 is formed in semiconductor body 406 including drift region 407, base region 408, and parasitic layer regions 430a, 430b, 430c, and 430d, corresponding to semiconductor body 106 including drift region 107, base region 108, and the regions of parasitic layer 130 appearing in FIG. 1. Also shown in FIG. 4 are termination trenches 426a and 426b, their trench insulators 423, and trench fillers 428a and 428b, corresponding respectively to termination trenches 126a and 126b, their trench insulators 123, and trench fillers 128a and 128b, in FIG. 1. FIG. 4 further includes mesa regions 425a, 425b, and 425c, corresponding respectively to the mesa regions between voltage controlled termination structure 122 and termination trench 126a, between termination trench 126a and termination trench 126b, and bordering termination trench 126b on the right, in FIG. 1.

Comparison of FIG. 4 with FIG. 2 under the same applied drain voltage conditions, e.g., approximately 22 V applied to drain contact 105 in FIG. 1, reveals some of the advantages provided by the present novel approach. Because, unlike floating termination structure 222, in FIG. 2, termination structure 422, in FIG. 4, is voltage controlled by virtue of being electrically coupled to either the gate or source terminal of the semiconductor device for which it provides field termination, there is no abrupt voltage transition where voltage controlled termination structure 422 meets parasitic layer region 430a.

Consequently, the conditions present in FIG. 2 and resulting in production of Idss leakage current 232 in that Figure, are absent from termination region 420, resulting in a corresponding absence of a drain-source leakage current. That is to say, controlling the voltage of termination structure 422 by electrically coupling electrode 424 to the gate or source of semiconductor device 100, in FIG. 1, prevents voltage controlled termination structure 422 from acting as a pseudo gate, and mitigates the presence of the pseudo source region represented by parasitic layer region 430a, to prevent genesis of an Idss leakage current. Thus, connection of electrode 124 and gate electrode 114, for example, as represented in FIG. 4, overcomes the drawbacks and deficiencies of the conventional art by significantly reducing or eliminating current leakage during an OFF state of semiconductor device 100.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor device including a voltage controlled termination structure, said semiconductor device comprising:
    an active area including a base region of a first conductivity type formed in a semiconductor body of a second conductivity type formed over a first major surface of a substrate of said second conductivity type;
    a termination region formed adjacent said active area and including said voltage controlled termination structure and at least one termination trench having a conductive trench filler disposed therein, said voltage controlled termination structure extending through said base region into said semiconductor body of said second conductivity type;
    said voltage controlled termination structure comprising an electrode electrically connected to one of a gate electrode and a source region of said semiconductor device;
    said at least one termination trench being floating.

2. The semiconductor device of claim 1, further comprising a parasitic layer of said second conductivity type situated over said base region and adjacent said voltage controlled termination structure.

3. The semiconductor device of claim 1, further comprising a drain contact formed over a second major surface of said substrate, opposite said first major surface.

4. The semiconductor device of claim 1, wherein said semiconductor device comprises a trench metal-oxide-semiconductor field-effect transistor (MOSFET).

5. The semiconductor device of claim 1, wherein said semiconductor device is implemented as a low gate-to-source voltage (low Vgs) device.

6. The semiconductor device of claim 1, wherein said semiconductor body comprises an epitaxial silicon body.

7. The semiconductor device of claim 1, wherein said electrode of said voltage controlled termination structure is electrically connected to said gate electrode of said semiconductor device.

8. The semiconductor device of claim 1, wherein said electrode of said voltage controlled termination structure is electrically connected to said source region of said semiconductor device.

9. A trench metal-oxide-semiconductor field-effect transistor (MOSFET) including a voltage controlled termination structure, said trench MOSFET comprising:
    an active area including an insulated gate trench and a highly doped source region, formed in a base region of a first conductivity type formed over a drift body of a second conductivity type;
    a termination region adjacent said active area and including said voltage controlled termination structure and at least one termination trench having a conductive trench filler disposed therein;
    said voltage controlled termination structure extending through said base region into said drift body and comprising an electrode electrically connected to one of a gate electrode and said highly doped source region of said trench MOSFET:
    said at least one termination trench being floating.

10. The trench MOSFET of claim 9, wherein said trench MOSFET is implemented as a low gate-to-source voltage (low Vgs) device.

11. The trench MOSFET of claim 9, wherein said electrode of said voltage controlled termination structure is electrically connected to said gate electrode of said trench MOSFET.

12. The trench MOSFET of claim 9, wherein said electrode of said voltage controlled termination structure is electrically connected to said highly doped source region of said trench MOSFET.

13. A method for fabricating a semiconductor device including a voltage controlled termination structure, said method comprising:
    forming an active area including a base region of a first conductivity type in a semiconductor body of a second conductivity type formed over a first major surface of a substrate of said second conductivity type;
    establishing a termination region including said voltage controlled termination structure and at least one termination trench having a conductive trench filler disposed therein in said semiconductor body adjacent said active area, said voltage controlled termination structure extending through said base region into said semiconductor body of said second conductivity type;
    electrically connecting an electrode of said voltage controlled termination structure to a terminal of said semiconductor device:
    said at least one termination trench being floating.

14. The method of claim 13, wherein forming said active area including said base region results in formation of a parasitic layer of said second conductivity type situated over said base region and adjacent said voltage controlled termination structure.

15. The method of claim 13, further comprising forming a drain contact on a second major surface of said substrate opposite said first major surface.

16. The method of claim 13, wherein said semiconductor body comprises an epitaxial silicon body.

17. The method of claim 13, wherein said semiconductor device comprises a trench metal-oxide-semiconductor field-effect transistor (MOSFET).

18. The method of claim 13, wherein said semiconductor device is a low gate-to-source voltage (low Vgs) device.

19. The method of claim 13, wherein electrically connecting said electrode of said voltage controlled termination structure to said terminal of said semiconductor device comprises connecting said electrode to a gate terminal of said semiconductor device.

20. The method of claim 13, wherein electrically connecting said electrode of said voltage controlled termination structure to said terminal of said semiconductor device comprises connecting said electrode to a source terminal of said semiconductor device.

* * * * *